US005684741A

United States Patent [19]
Talreja

[11] Patent Number: 5,684,741
[45] Date of Patent: Nov. 4, 1997

[54] AUTO-VERIFICATION OF PROGRAMMING FLASH MEMORY CELLS

[75] Inventor: Sanjay Talreja, Folsom, Calif.

[73] Assignee: Intel Corporation, Santa Clara, Calif.

[21] Appl. No.: 578,505

[22] Filed: Dec. 26, 1995

[51] Int. Cl.$^6$ ............................................. G11C 7/00
[52] U.S. Cl. .................. 365/185.22; 365/185.23; 365/185.03
[58] Field of Search ................ 365/185.22, 185.23, 365/185.28, 185.03, 185.3, 185.33, 185.21

[56] References Cited

U.S. PATENT DOCUMENTS

| | | | |
|---|---|---|---|
| 4,460,982 | 7/1984 | Gee et al. | 365/185.19 |
| 4,797,856 | 1/1989 | Lee et al. | 365/185.28 |
| 5,200,919 | 4/1993 | Kaya | 365/185.28 |
| 5,446,656 | 8/1995 | Bauer et al. | 365/185.2 |
| 5,495,442 | 2/1996 | Cernea et al. | 365/185.03 |

OTHER PUBLICATIONS

A 34 Mb. 3.3V. Serial Flash EEPROM For Solid–State Disk Applications, Cernea et al; 1995 IEEE INternational Solid–State Circuits Conference.

Primary Examiner—David C. Nelms
Assistant Examiner—Vu A. Le
Attorney, Agent, or Firm—Blakely, Sokoloff, Taylor & Zafman

[57] ABSTRACT

A method for verifying that a flash EEPROM memory device has reached a programmed state including the steps of providing a programming pulse of a preselected level and unspecified duration to the device, monitoring the current through the device as the programming pulse is applied, and providing a signal to terminate the programming pulse when the current through the device reaches a state equivalent to that through a programmed device.

17 Claims, 4 Drawing Sheets

AUTO-VERIFICATION OF PROGRAMMING FLASH MEMORY CELLS

BACKGROUND OF THE INVENTION

1. Field of the Invention

This invention relates to computer systems and, more particularly, to methods and apparatus for verifying the state of a programmed flash EEPROM memory cell.

2. History of the Prior Art

Recently, flash electrically-erasable programmable read-only memory (EEPROM) storage devices have been used in arrays as a new form of long term storage. These arrays may be designed to accomplish many of the operations previously accomplished by other forms of memory in digital systems and especially in computer systems. For example, flash memory is being used to replace various read-only memories such as the basic input/output startup (BIOS) memory of a computer system. The ability to program flash memory in place offers substantial advantages over more conventional EPROM memory. More recently, flash memory has been used to provide a smaller lighter functional equivalent of an electro-mechanical hard disk drive. Flash memory is useful because it may be read more rapidly and is not as sensitive to physical damage as an electro-mechanical hard disk drive. Flash hard drive memories are especially useful in portable computers where space is at a premium and weight is extremely important.

A flash EEPROM memory array is typically constructed of a large plurality of floating-gate metal-oxide-silicon field effect transistor devices arranged as memory cells in typical row and column fashion with circuitry for accessing individual cells and placing the memory transistors of those cells in different memory conditions. Such memory transistors may be programmed by storing a charge on the floating gate. This charge remains when power is removed from the array.

This charge on the floating gate (typically called a "zero" or programmed condition with a two state flash memory cell) or its absence (a "one" or erased condition) may be detected when the device is read. The level of charge on the floating gate of a flash memory cell determines the current which flows through the cell which in turn determines a voltage at one input of a sense amplifier. The state of a flash memory cell is detected by comparing the voltage generated by the current through the memory cell with a voltage at another input to the sense amplifier generated by a current flowing through an essentially identical flash EEPROM reference cell. In an N type flash memory cell, when the voltage generated by the current through the memory cell is less than the voltage across the reference cell, the device is in the erased state. When the voltage generated by the current through the memory cell is greater, the device is in the programmed state.

Similar techniques may be used to detect a number of states of a memory cell so that more than two conditions may be detected.

In order to detect the state of a memory cell, a reference cell must conduct a precise amount of current so that an appropriate reference voltage is produced; typically, this is a current which produces a voltage midway between the voltages produced by the memory cell in the two states. Unless the reference voltage is correct, the state of the memory cell cannot be accurately tested. Thus, both the reference cell and the memory cell must be programmed accurately to accomplish storage and detection in a flash EEPROM memory array.

The method by which the programming is accomplished in the prior art requires that a programming voltage pulse be applied to the flash cell for a selected period. In general, this period is kept below a period sufficient to program the cell because over-programming is generally undesirable, especially in a reference cell. After some period the pulse is removed, and the voltage across the cell is tested; typically this requires separate sensing circuitry. If the flash cell has been programmed to the correct level, programming stops. If the cell is not at the correct level (and this is the typical case), the programming pulse is applied again. This process continues until the cell reaches the appropriate level.

This same process is used to program the voltage level on the flash memory cells in other operations in which the cells are raised to the programmed state. For example, when a substantial number of the cells of a block of a flash EEPROM memory array are invalid, all of the cells of the block are erased together. To accomplish this, all of the cells are first placed in the programmed state (preconditioned) and then all of the cells are erased. Similarly, if a block of cells has been preconditioned but when tested all of the cells have not reached the programmed state, those cells are reprogrammed.

In some cases, after the cells have been pre-conditioned and erased, some cells are found to have been over-erased. A pulse is then applied to those cells which have been over-erased to bring them back to the erased condition in an operation referred to as post-conditioning.

As may be seen, such a process requires a large number of iterative steps using a substantial amount of time and a substantial number of components in addition to those components used for simply sensing the condition of a cell.

It is desirable to verify the program state of flash memory cells using a process which is more rapid and requires less circuitry than that used in the prior art and which does not cause over-programming of the cells.

SUMMARY OF THE INVENTION

It is, therefore, an object of the present invention to provide an apparatus and method for programming flash memory cells more rapidly than may be accomplished utilizing prior art circuitry and techniques.

This and other objects of the present invention are realized by a circuit which tests the current through a flash EEPROM device as it is being programmed and provides feedback to discontinue the programming when the current reaches a preselected level equivalent to a level which provides a desired voltage when the device is properly programmed.

The objects and features of the invention will be better understood by reference to the detailed description which follows taken together with the drawings in which like elements are referred to by like designations throughout the several views.

Notation And Nomenclature

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
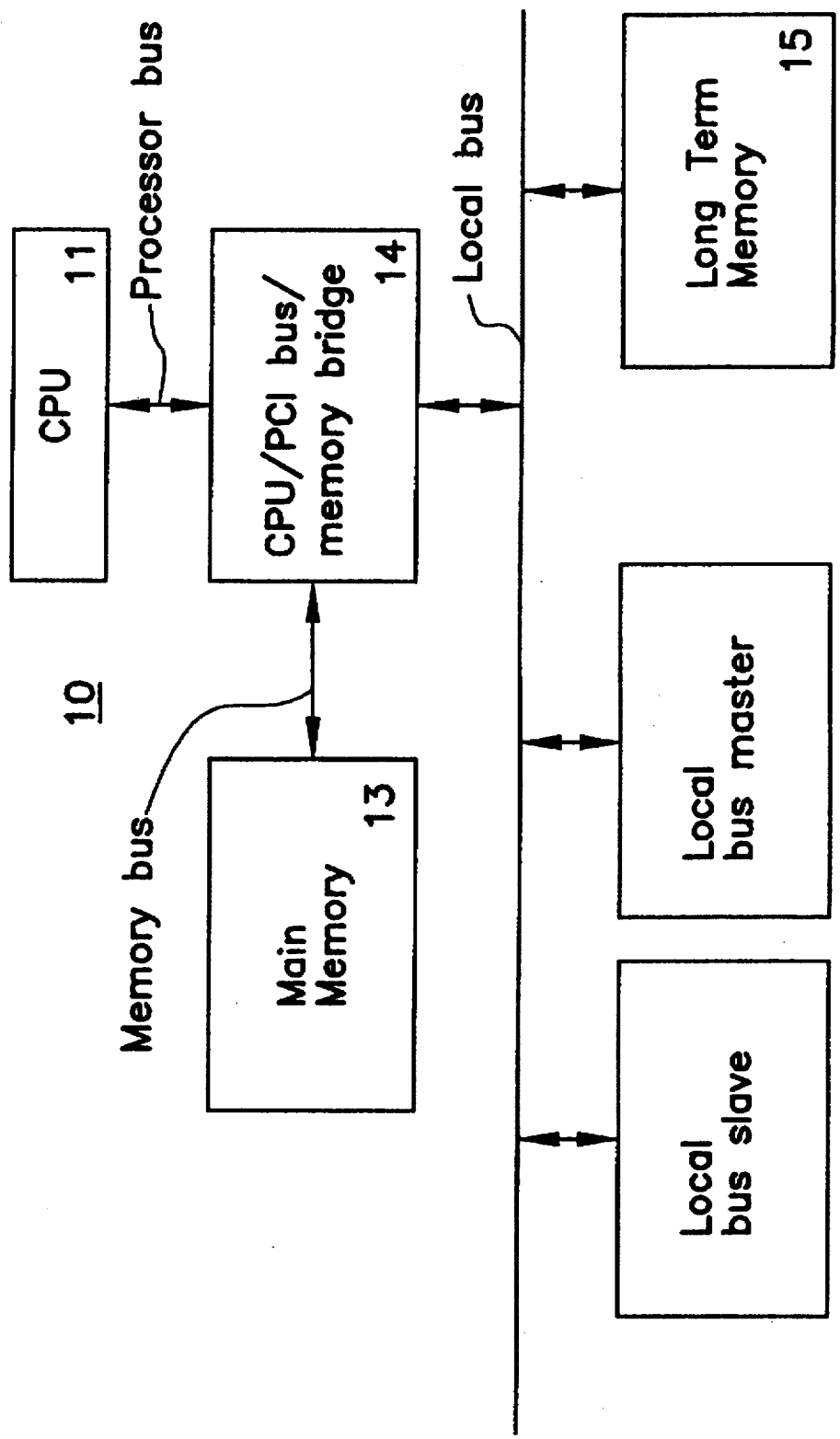
FIG. 1 is a block diagram of a computer system designed in accordance with the present invention.

Referring now to FIG. 1, there is illustrated a computer system 10 configured in accordance with one embodiment of the present invention. The system 10 illustrated includes a central processing unit 11 which executes the various instructions provided to control the operations of the system 10. The central processing unit 11 is typically joined by a processor bus to a bridge circuit 14. The bridge circuit 14 is also joined by a memory bus to main memory 13 which is typically constructed of dynamic random access memory (DRAM) arranged in a manner well known to those skilled in the prior art to store information during a period in which power is provided to the system 10. The bridge circuit includes, among other things, memory control circuitry and circuitry which controls access to an input/output bus 12 adapted to carry information between the various components of the system 10. In FIG. 1, the bus 12 is preferably a peripheral component interface (PCI) bus or other local bus adapted to provide especially fast transfers of data. This bus is chosen in FIG. 1 for illustrative purposes only.

In a typical system 10, various input/output devices are connected to the bus 12 as bus master and bus slave circuits. In the present illustration, for example, long term memory 15 may be joined to the PCI bus 12 as a bus slave circuit. Other input/output devices such as sound boards, frame buffers, and the like may also be joined to the bus 12.

Rather than the electro-mechanical hard disk drive which is typically used for long term memory, a flash EEPROM memory array may be used as the long term memory 15. Such flash EEPROM memory arrays typically include an array of memory device for programming, reading, and erasing of the memory array. In addition, the flash EEPROM memory array typically includes a flash controller which may include a number of component circuits which have been described at length in the prior art in order to accomplish its operations. For example, a controller may utilize a microprocessor and local buffer memory to carry out operations with respect to the memory array under control of local read only memory or firmware. Alternatively, the controller may include a microcontroller and state machines designed to carry out the various functions with respect to the module. The functions which the controller is capable of include, among other things, accessing the flash memory array for reading, writing, and erasing. Such a controller includes the logic necessary (whether in software, firmware, or hardware) to accomplish the various steps necessary to each of these functions which are well known to those skilled in the art.

Figure 2:
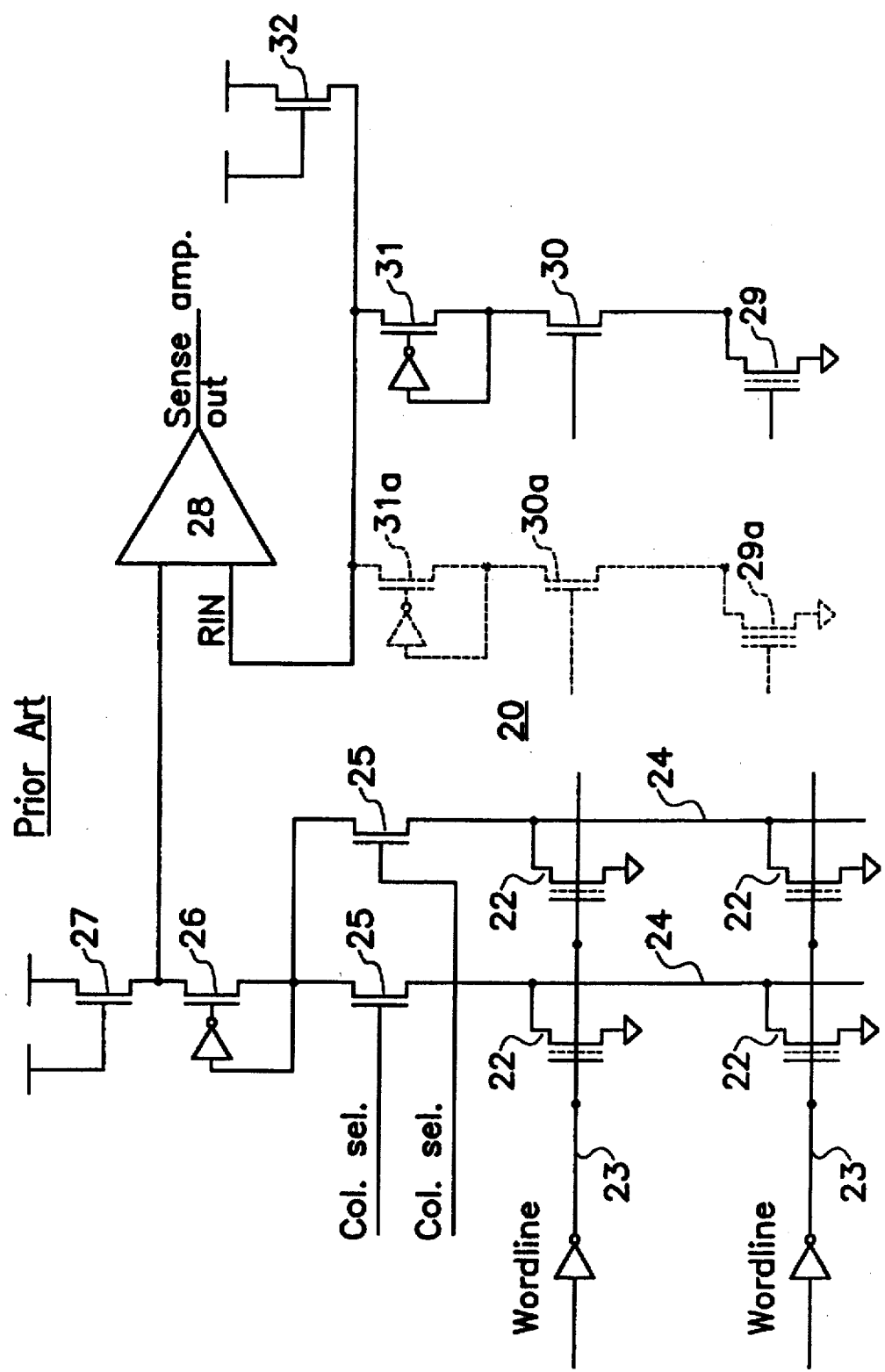
FIG. 2 is a block diagram of circuitry used to program a flash memory cell in accordance with the teaching of the prior art.

The flash EEPROM memory array itself is constructed of floating gate field effect transistor devices. Such memory transistors may be programmed to store a charge on the floating gate, and the condition of the floating gates may be detected by interrogating the cells to determine if they are programmed or erased. FIG. 2 illustrates a portion of a typical flash EEPROM memory array constructed in accordance with the teaching of the prior art. As may be seen in FIG. 2, the array 20 includes a plurality of floating gate field effect transistor devices 22 arranged in rows and columns. Although not shown in detail, circuitry is provided for addressing any particular device 22 at a particular row and column by providing an enabling signal to the gate of the one of a plurality of column select devices to which the drain of the particular device 22 is connected and an enabling signal through a wordline 23 to the gate of the particular device 22.

In FIG. 2, the typical arrangement of memory transistors 22 for reading memory cells in prior art arrangements is illustrated. As may be seen, each memory transistor 22 has its gate terminal joined to a wordline 23, its source terminal connected to ground, and its drain terminal connected to a bitline 24. A N type FET transistor device 25 is arranged as a column select device to allow any particular column to be selected. The drain terminals of the devices 25 are joined through a N type device 26 connected in a cascode arrangement to provide drain bias for the devices 22. The source terminal of the device 26 is connected to a N type device 27 (which may be a device having a low threshold voltage Vt) joined to Vcc.

A typical device 22 is selectively placed in the zero or programmed condition by placing approximately twelve volts on the gate terminal, approximately six volts on the drain terminal, and ground on the source terminal. A device which is programmed has a substantial charge placed on its floating gate.

Typically, an N type device 22 is erased (placed in a one condition) by applying a value such as twelve volts to its source terminal while grounding the gate terminal and floating the drain terminal. When a device is erased, most of the charge on the floating gate is tunneled from the floating gate.

The condition of a device 22 is read by detecting the charge on the floating gate. This is accomplished in a typical circuit by placing approximately five volts on the gate terminal, a bias voltage through a cascode device and feedback on the drain terminal, and grounding the source terminal. When a device 22 is functioning within tolerances, the gate-source voltage is greater than the threshold voltage Vt of the erased cell and is less than the threshold voltage Vt of the programmed cell. Thus, a device 22 which has been programmed with a substantial charge on the floating gate conducts less current while a device which has been erased transfers a substantially greater current.

In order to determine the charge which is stored by the floating gate of a memory transistors in a flash EEPROM array when the device is read, reference devices are utilized. These reference devices are floating gate field effect transistor devices essentially identical to the memory transistors and connected in similar circuit arrangements. The reference devices are programmed to precise values by placing charges on the floating gates. When the memory cells are read, the value of the charge stored by each memory transistor is tested against the value of the charge stored by the reference cells to determine the condition (state) of the memory cell. In a typical flash EEPROM memory array in which only two possible conditions are available for each memory cell, the reference devices are programmed to states midway between the programmed and erased states of the memory cells to produce a particular value when interrogated.

Thus, when five volts is applied to the gate terminal of a particular device 22 in a selected column, that device 22 transfers current if five volts is greater than the threshold voltage Vt produced by the charge stored on its floating gate and does not transfer a current if five volts is less than the threshold voltage Vt. If the device 22 transfers current, this current causes voltage drops across the device 26 and the device 27. The voltage at the drain terminal of the device 26 is furnished to one input of a sense amplifier 28. The sense amplifier 28 receives at its other input a voltage generated in response to a current through a reference flash transistor device 29 arranged in a similar current path with devices 30, 31, and 32 which are chosen to be identical to the devices 25, 26, and 27. If the current through the device 22 being read is greater than the current through the reference device 29, the sense amplifier 28 produces one output signal. If the current through the device 22 being read is less than the current through the reference device 29, the sense amplifier 28 produces a different output signal.

Figure 3:
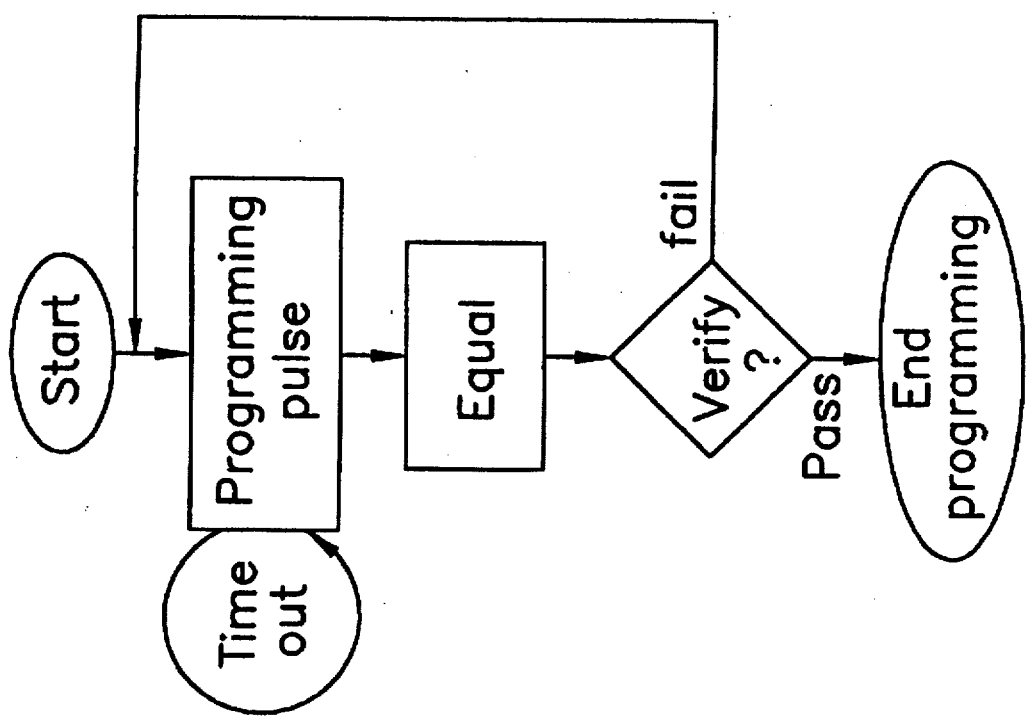
FIG. 3 is a flow chart illustrating the steps of a method of programming a flash memory cell in accordance with the teaching of the prior art.

Programming is accomplished in accordance with the prior art as shown in the process described in FIG. 3 by applying the twelve volt gate voltage for a prescribed period, then removing the programming pulse, equalizing the voltages on the selected column, and testing the voltage generated by the current through the cell against a test reference value generated by a reference bitline (shown in dotted lines and including devices 29a, 30a, and 31a) which may be switched into the circuit of the flash array. The equalization is necessary because the voltages applied to the column are significantly different during the programming and testing steps. The voltage level produced at the sense amplifier 28 by this reference bitline is different than that produced by the reference bitline including the device 29 since the device 29a is programmed. Moreover, the different voltage allows the voltage produced by the programmed device 22 to be placed at a level substantially greater than the read level produced by the device 29.

If the particular device tested is in the programmed state, the programming of that cell ceases. If the device 22 has not yet reached the programmed state, another programming pulse is applied to the gate terminal for a preselected period. Then the voltage generated by the current through the device 22 is again tested using the test reference circuitry. This process continues until the device 22 reaches the programmed state. A similar process occurs when a block of the array including a plurality of devices 22 is pre-conditioned for a block erase operation and when individual devices 22 in a block which has been erased have been over-erased and are post-conditioned.

As may be seen, the process for programming a flash EEPROM memory device takes an extensive amount of time and requires a substantial amount of circuitry in addition to that used for detecting the state of any device 22. This is especially true because of the need to go from a programming to a test state in which different circuitry is utilized and an equalization process must be carried out.

Figure 4:
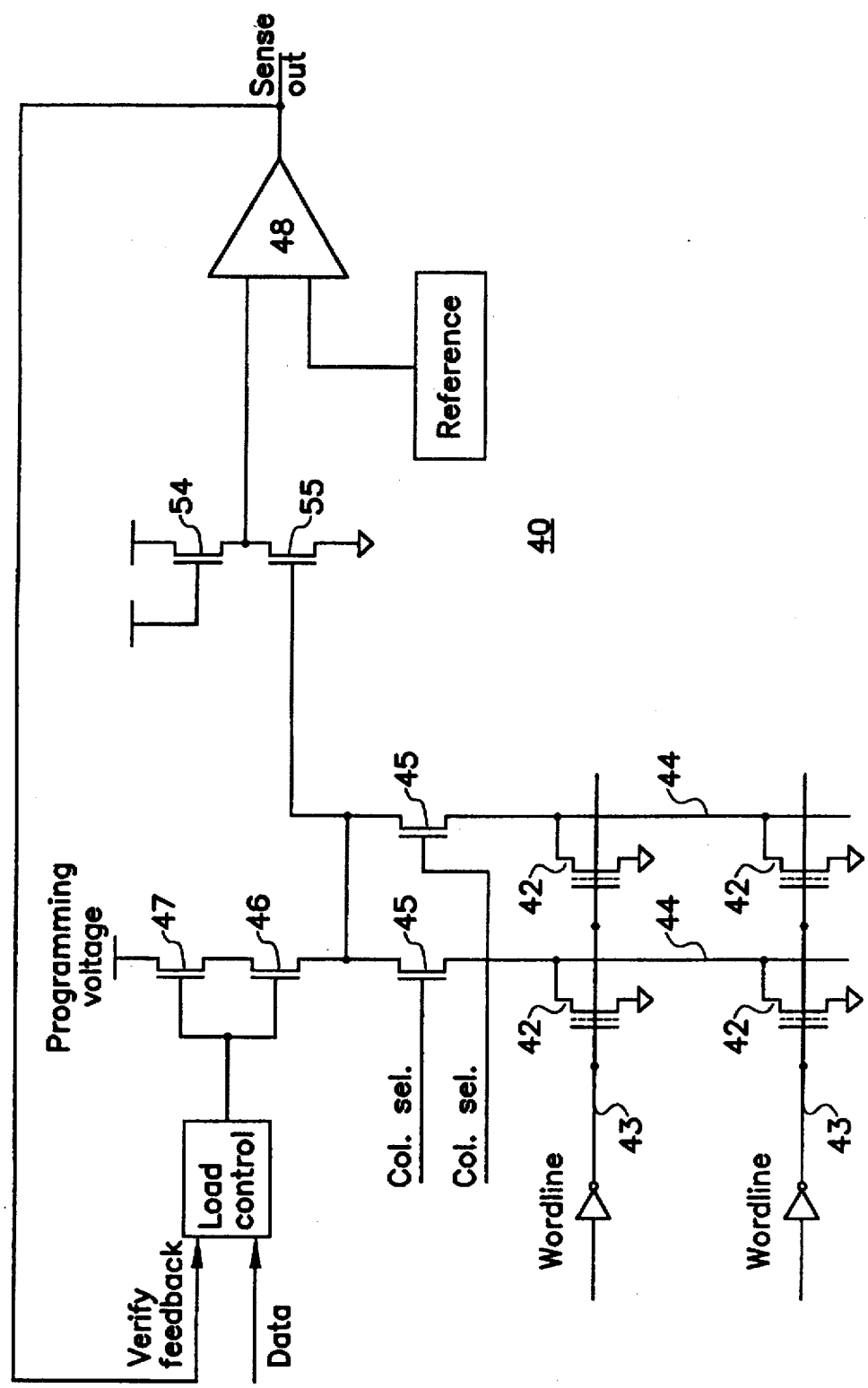
FIG. 4 is a block diagram of circuitry used to program a flash memory cell in accordance with the teaching of the present invention.

Circuitry designed in accordance with the present invention is illustrated in FIG. 4. This circuitry provides a new facility for carrying out a new process by which a substantial reduction in the time required to program flash memory devices is realized. The circuitry also reduces the number of circuit components and the complexity of the circuitry. The circuit 40 illustrates an arrangement of memory transistors 42 for reading memory cells. As may be seen, each flash memory transistor 42 has its gate terminal joined to a wordline 43, its source terminal connected to ground, and its drain terminal connected to a bitline 44. N type FET transistor devices 45 are arranged as a column select devices. Drain bias for the devices 42 is provided through a N type device 46 and a N type device 47 joined to Vcc.

Rather than providing an output voltage from the bitline 44 between the devices 46 and 47 (as was the case in the circuit of FIG. 2), the circuit 40 includes a second pair of N type devices 54 and 55 having their source and drain terminals joined between a power supply and ground. The gate terminal of the device 55 is joined to the source terminal of the device 46 in a current mirroring arrangement. Typically, the devices 54 and 55 are chosen to have values essentially identical to those of the devices 46 and 47 so that the same current flows through the devices 54 and 55 as flows through the devices 46 and 47. Thus, the same value of voltage appears between the devices 54 and 55 as appears between the devices 46 and 47. This voltage is applied to one input of a sense amplifier 48 and tested against a programming reference voltage.

However, rather than applying a programming pulse of specified duration to the gate terminal of the selected device 42, a programming pulse of unlimited duration is applied. This pulse causes current to flow through the selected device 42 at an initially high value and gradually decrease as the device 42 approaches its programmed state. This causes the value of the voltage furnished by the current-mirroring input to the sense amplifier 48 between the devices 54 and 55 to rise toward the value of Vpp. When the voltage at the input to the sense amplifier 48 becomes greater than the reference voltage to the sense amplifier 48, the output value furnished by the sense amplifier switches to the opposite state. This causes a signal to be furnished to a load control circuit which disables the transistor devices 46 and 47 thereby stopping the flow of programming current through the device 42. Since the switch in the output produced by the sense amplifier occurs as the voltage produced by the current through the device 42 becomes just greater than the voltage produced by current through a device 42 in the programmed state, the switch in output and the feedback to the cut off the programming current occur at the correct point to verify the programming operation during programming itself.

Figure 5:
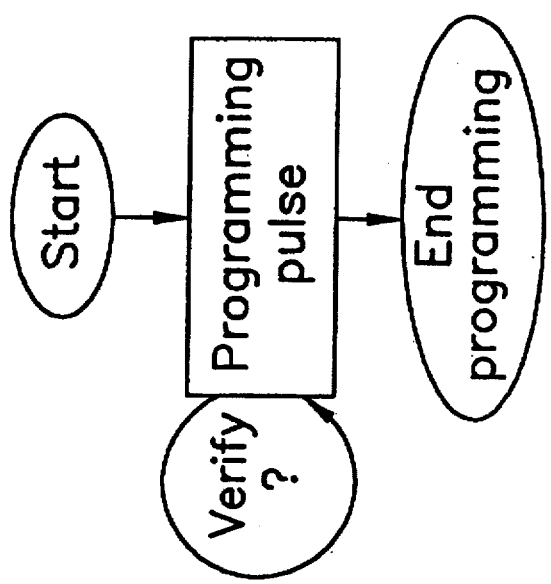
FIG. 5 is a flow chart illustrating the steps of a method of programming a flash memory cell in accordance with the teaching of the present invention.

This circuitry thus shortens the process from that illustrated in FIG. 3 which is practiced by prior art circuits to a process illustrated in FIG. 5. As may be seen, in this shortened process, a single programming pulse of undetermined duration is applied and continued until the feedback signal indicates that the device 42 is programmed; then the programming pulse is terminated. Thus, there is no need to apply a plurality of programming pulses, and there is no need to switch between programming and testing modes in order to verify that the correct programmed state of the device 42 has been reached. This eliminates the necessity of equalizing the voltages at each transition between test and programming modes and substantially shortens the time required to program the memory devices of a flash EEPROM memory array.

This process and circuitry offers distinct advantages over prior art processes and circuitry. The process is shorter, requires fewer components, and utilizes less energy. Since an output signaling that a device is programmed from a sense amplifier terminates the programming pulse, a device already in the programmed state will never receive programming current for more than a time sufficient to produce an output. In prior art arrangements, at least the initial programming pulse has to be provided for its entire duration.

Not only may the process be utilized whenever a memory cell is written to store data, the same process may be used to place the memory devices in a programmed state as a precondition to erasing all of the devices in a block of a flash EEPROM memory array. The same process may also be used during preconditioning and post-conditioning processes.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for verifying that a flash EEPROM memory device in a flash EEPROM memory array has reached a particular programmed state comprising:
means for providing a programming pulse of a preselected level and unspecified duration to the device,
means for monitoring the current through the device as the programming pulse is applied, the means for monitoring the current through the device comprising:
  means for mirroring the current through the flash EEPROM memory device through devices selected to provide an output voltage, and
  means for comparing the output voltage to a reference voltage indicating a device is in the particular programmed state, and
means for providing a signal to terminate the programming pulse when the current through the device reaches a state equivalent to that through a device in the desired programmed state.

2. A circuit for verifying that a flash EEPROM memory device in a flash EEPROM memory array has reached a particular programmed state as claimed in claim 1 in which the means for providing a signal to terminate the programming pulse when the current through the device reaches a state equivalent to that through a device in the desired programmed state comprises:
means for sensing the output signal, and
means for terminating the programming pulse when the output signal changes state.

3. A circuit for verifying that a flash EEPROM memory device in a flash EEPROM memory array has reached a particular programmed state as claimed in claim 1 in which the means for providing a programming pulse of a preselected level and unspecified duration to the device comprises means for providing a programming voltage to a bitline to which the flash EEPROM memory device is joined utilizing devices which are disabled when the state of the output signal switches.

4. A circuit for verifying that a flash EEPROM memory device in a flash EEPROM memory array has reached a particular programmed state as claimed in claim 1:
in which the means for providing a signal to terminate the programming pulse when the current through the device reaches a state equivalent to that through a device in the particular programmed state comprises:
  means for sensing the output signal, and
  means for terminating the programming pulse when the output signal changes state; and
in which the means for providing a programming pulse of a preselected level and unspecified duration to the device comprises means for providing a programming voltage to a bitline to which the flash EEPROM memory device is joined utilizing devices which are disabled when the state of the output signal switches.

5. A method for verifying that a flash EEPROM memory device has reached a particular state comprising the steps of:
providing a pulse of a preselected level and unspecified duration to the device,
monitoring the current through the device as the pulse is applied, monitoring the current through the device comprising the steps of:
  mirroring the current through the flash EEPROM memory device through transistor devices selected to provide an output voltage, and
  comparing the output voltage to a reference voltage indicating a device is in the particular state to generate an output signal which switches when a device reaches the particular state; and
providing a signal to terminate the pulse when the current through the device reaches a state equivalent to that through a device in the particular state.

6. A method for verifying that a flash EEPROM memory device has reached a particular state as claimed in claim 5 in which the step of providing a signal to terminate the pulse when the current through the device reaches a state equivalent to that through a device in the particular state comprises the steps of:
sensing the output signal, and
terminating the pulse when the output signal changes state.

7. A method for verifying that a flash EEPROM memory device has reached a particular state as claimed in claim 5 in which the step of providing a pulse of a preselected level and unspecified duration to the device comprises providing a voltage to a bitline to which the flash EEPROM memory device is joined utilizing devices which are disabled when the state of the output signal switches.

8. A method for verifying that a flash EEPROM memory device has reached a particular state as claimed in claim 5, in which the step of providing a signal to terminate the pulse when the current through the device reaches a state equivalent to that through a device in the particular state comprises the steps of:
sensing an output from the sense amplifier, and
terminating the pulse when the output from the sense amplifier changes state; and
in which the step of providing a pulse of a preselected level and unspecified duration to the device comprises providing a voltage to a bitline to which the flash EEPROM memory device is joined utilizing devices which are disabled when the state of the output signal switches.

9. A circuit for verifying that a flash EEPROM memory device in a flash EEPROM memory array of memory devices connected in rows to wordlines and columns to bitlines has reached a particular programmed state comprising:
a switching circuit for providing a pulse of a preselected level and unspecified duration to the memory device,
a circuit for monitoring the current through the device as the programming pulse is applied, the circuit for monitoring the current through the device comprising:
a current mirror circuit for mirroring the current through the flash EEPROM memory device including devices selected to provide an output voltage, and
a sense amplifier for comparing the output voltage at one input terminal to a reference voltage indicating a device is in the particular programmed state at another input terminal, and
a feedback circuit for providing a signal to terminate the programming pulse when the current through the device reaches a state equivalent to that through a device in the desired programmed state.

10. A circuit for verifying that a flash EEPROM memory device in a flash EEPROM memory array of memory devices connected in rows to wordlines and columns to bitlines has reached a particular programmed state as claimed in claim 9 in which the feedback circuit for providing a signal to terminate the programming pulse when the current through the device reaches a state equivalent to that through a device in the desired programmed state comprises:
a circuit connected to sense an output of the sense amplifier and to cause the switching circuit to terminate the programming pulse when the output of the sense amplifier changes state.

11. A circuit for verifying that a flash EEPROM memory device in a flash EEPROM memory array of memory devices connected in rows to wordlines and columns to bitlines has reached a particular programmed state as claimed in claim 9 in which the switching circuit for providing a programming pulse of a preselected level and unspecified duration to the device comprises transistor devices joining a programming voltage to a bitline to which the flash EEPROM memory device is joined which transistor devices are disabled when the state of the output of the sense amplifier switches.

12. A circuit for verifying that a flash EEPROM memory device in a flash EEPROM memory array has reached a particular programmed state as claimed in claim 9:
in which the feedback circuit for providing a signal to terminate the programming pulse when the current through the device reaches a state equivalent to that through a device in the desired programmed state comprises:
a circuit connected to sense an output of the sense amplifier and to cause the switching circuit to terminate the programming pulse when the output of the sense amplifier changes state; and
in which the switching circuit for providing a pulse of a preselected level and unspecified duration to the memory device comprises transistor devices joining a programming voltage to a bitline to which the flash EEPROM memory device is joined which transistor devices are disabled when the state of the output of the sense amplifier switches.

13. A computer system comprising:
a central processing unit;
an input/output bus;
a bridge circuit joining the central processing unit to the input/output bus; and
a flash EEPROM memory array for providing long term storage joined to the input/output bus,
the flash EEPROM memory array comprising:
a plurality of flash EEPROM memory devices connected in rows to wordlines and columns to bitlines, and
a circuit for verifying that a flash EEPROM memory device has reached a particular programmed state comprising:
a switching circuit for providing a pulse of a preselected level and unspecified duration to the memory device,
a circuit for monitoring the current through the device as the programming pulse is applied, and
a feedback circuit for providing a signal to terminate the programming pulse when the current through the device reaches a state equivalent to that through a device in the desired programmed state.

14. A computer system as claimed in claim 13 in which the circuit for monitoring the current through the device as the programming pulse is applied comprises:
a current mirror circuit for mirroring the current through the flash EEPROM memory device including devices selected to provide an output voltage, and
a sense amplifier for comparing the output voltage at one input terminal to a reference voltage indicating a device in the particular programmed state at another input terminal.

15. A computer system as claimed in claim 14 in which the feedback circuit for providing a signal to terminate the programming pulse when the current through the device reaches a state equivalent to that through a device in the desired programmed state comprises:
a circuit connected to sense an output of the sense amplifier and to cause the switching circuit to terminate the programming pulse when the output of the sense amplifier changes state.

16. A computer system as claimed in claim 13 in which the switching circuit for providing a programming pulse of a preselected level and unspecified duration to the device comprises transistor devices joining a programming voltage to a bitline to which the flash EEPROM memory device is joined which transistor devices are disabled when the state of the output of the sense amplifier switches.

17. A computer system as claimed in claim 13:
in which the circuit for monitoring the current through the device as the programming pulse is applied comprises:
a current mirror circuit for mirroring the current through the flash EEPROM memory device including devices selected to provide an output voltage, and
a sense amplifier for comparing the output voltage at one input terminal to a reference voltage indicating a device in the particular programmed state at another input terminal, and;
in which the feedback circuit for providing a signal to terminate the programming pulse when the current through the device reaches a state equivalent to that through a device in the desired programmed state comprises:
a circuit connected to sense an output of the sense amplifier and to cause the switching circuit to terminate the programming pulse when the output of the sense amplifier changes state; and
in which the switching circuit for providing a pulse of a preselected level and unspecified duration to the memory device comprises transistor devices joining a programming voltage to a bitline to which the flash EEPROM memory device is joined which transistor devices are disabled when the state of the output of the sense amplifier switches.

* * * * *